(12) United States Patent
Okada et al.

(10) Patent No.: US 7,493,239 B2
(45) Date of Patent: Feb. 17, 2009

(54) APPARATUS FOR PROCESSING PARTS INFORMATION IN A THREE DIMENSIONAL CAD SYSTEM AND METHOD THEREOF

(75) Inventors: Yuki Okada, Kanagawa-ken (JP); Shingo Fujii, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 453 days.

(21) Appl. No.: 10/952,430

(22) Filed: Sep. 29, 2004

(65) Prior Publication Data

US 2005/0102051 A1   May 12, 2005

(30) Foreign Application Priority Data

Sep. 30, 2003   (JP) ............... 2003-342384

(51) Int. Cl.
*G06F 17/50* (2006.01)
(52) U.S. Cl. ............... 703/1; 700/182; 700/97; 345/653
(58) Field of Classification Search ............ 703/1; 705/1; 700/165, 187, 107, 121, 110, 97, 700/182; 345/846, 964; 164/4.1; 707/101; 107/101
See application file for complete search history.

(56) References Cited

U.S. PATENT DOCUMENTS

| | | | | |
|---|---|---|---|---|
| 6,473,673 | B1* | 10/2002 | Kleyman et al. | 700/182 |
| 7,016,747 | B1* | 3/2006 | Ninomiya | 700/97 |
| 2002/0038163 | A1* | 3/2002 | Hazama | 700/165 |
| 2003/0010465 | A1* | 1/2003 | Miyamoto et al. | 164/4.1 |
| 2003/0067496 | A1* | 4/2003 | Tasker et al. | 345/846 |
| 2003/0187534 | A1* | 10/2003 | Suzuki et al. | 700/107 |
| 2003/0191554 | A1* | 10/2003 | Russell et al. | 700/187 |
| 2004/0015367 | A1* | 1/2004 | Nicastro et al. | 705/1 |
| 2004/0083019 | A1* | 4/2004 | Suzuki et al. | 700/110 |
| 2004/0088144 | A1* | 5/2004 | Ujiie | 703/1 |
| 2004/0145614 | A1* | 7/2004 | Takagaki et al. | 345/964 |
| 2005/0015175 | A1* | 1/2005 | Huang | 700/121 |
| 2006/0143202 | A1* | 6/2006 | Parker | 707/101 |

FOREIGN PATENT DOCUMENTS

| | | |
|---|---|---|
| JP | 10-240786 A | 9/1998 |
| JP | 2000-11030 A | 1/2000 |
| JP | 2001-52037 A | 2/2001 |

\* cited by examiner

*Primary Examiner*—Paul L Rodriguez
*Assistant Examiner*—Kandasamy Thangavelu
(74) *Attorney, Agent, or Firm*—Foley & Lardner LLP (57) ABSTRACT

An apparatus and a method for processing parts information in a three dimensional CAD system, which can easily handle the data for the parts or the arrangement of the parts are provided. An apparatus for processing parts information in a three dimensional CAD system includes a parts table, an arrangement adjusting unit, and an element data editor. The parts table has data of one or more the parts in a spreadsheet format. The data includes arrangement data and element data for the parts. The arrangement adjusting unit refers to the arrangement data of the parts and adjusts position of at least one of the parts. The element data editor refers to the element data for at least one of the parts and changes detailed configuration of the parts.

22 Claims, 12 Drawing Sheets

| Key Information | Name Information | Arrangement data/ Configuration data | Property Information |
|---|---|---|---|
| Key A *Same Characters for the same Part* — Row 1 | Part Name/ Number (on the 1st row) | Arrangement data of the Part (e.g. *Position and Angle in the Project Area*) (on the 1st row) | Property Information of the Part (on the 1st row) |
| Row 2- | Element Name/ Number (on after the 2nd rows) | Configuration data of the element (e.g. *Shape, Measurement, and Angle*) (on after the 2nd rows) | Property Information of the Element (on after the 2nd rows) |
| Key B *Same Characters for the same Part* — Row 1 | Part Name/ Number (on the 1st row) | Arrangement data of the Part (e.g. *Position and Angle in the Project Area*) (on the 1st row) | Property Information of the Part (on the 1st row) |
| Row 2- | Element Name/ Number (on after the 2nd rows) | Configuration data of the element (e.g. *Shape, Measurement, and Angle*) (on after the 2nd rows) | Property Information of the Element (on after the 2nd rows) |

1 → (table); 1A = upper two data columns grouping; 1B = lower grouping

APPARATUS FOR PROCESSING PARTS INFORMATION IN A THREE DIMENSIONAL CAD SYSTEM AND METHOD THEREOF

CROSS REFERENCE TO RELATED APPLICATION

This application is based upon and claims the benefit of priority from prior Japanese Patent Application No. 2003-342384 filed on Sep. 30, 2003, the entire contents of which are incorporated herein by reference.

FIELD OF THE INVENTION

This invention relates to a CAD system, and in particular to an apparatus and a method for processing parts information in a three dimensional CAD system.

BACKGROUND OF THE INVENTION

A three dimensional CAD system, which can adjust an arrangement of parts in a three dimensional virtual space, is used to design an architecture for a plant such as a thermal or nuclear power plant, or other facilities, or a product.

Conventional three dimensional CAD system is disclosed in Japanese patent publication (Kokai) 2000-11030. In one aspect, a method for improving an efficiency of designing process is disclosed in this application.

In a conventional three dimensional CAD system, the parts are selected from a parts database, which stores data of those parts. The parts chosen from the part database are arranged in a three dimensional virtual space typically via a graphical user interface (referred to as GUI). After that, an arrangement data of the parts in the three dimensional virtual space are stored in an parts arrangement database. In these conventional three dimensional CAD system, the part database is usually called as a library.

It is typical to use many of the same parts as common parts for the various architectures, plants, facilities or products. When designing such an object with three dimensional CAD system, it is convenient to get the data of those common parts from the parts database (library) and arrange the parts in the three dimensional virtual space. In other words, such common parts can be easily and repeatably arranged in the three dimensional virtual space when it has been stored in the parts database.

Conventionally, two well-known methods, solely or combined, are used to create and register the data of the common parts in the parts database of the three dimensional CAD system.

The first method includes registering all of the information (data) that is necessary to build a three dimensional configuration of the parts in the parts database. For example, a basic configurations such as a rectangular parallelepiped or a cylinder, and measurements (numerical values) for those basic configurations are registered together in the parts database for this method. The parts can be arranged in the three dimensional virtual space by retrieving this information from the parts database without changing or calculating this data with this method.

The second method includes running a program by setting parameter to build the parts. When getting the parts data from the parts database, parameters are input, for example, from an external file for this method. Input parameters with the parts data are used in the program and result in the configuration of the parts. When creating simple configured parts, it is useful to apply this method because similar configurations of such parts can be easily obtained by varying the parameters linearly. A cylinder-like configured heater used in a plant is one example of a simple configured part. With this method, once the parts are created and registered in the parts database, they are applicable to other similar parts. Therefore, this method is useful when a number of the parameters used is relatively smaller. On the contrary, when the parts have complicated configuration, a number of the parameters tend to be relatively larger, and it is difficult to build the parts in the three dimensional virtual space.

In conventional three dimensional CAD system, the parts database is separately built from the three dimensional CAD system. Therefore, one has to exit the three dimensional CAD system when they want to edit the parts database.

Further, a structure of data is not the same in the parts database as in the three dimensional CAD system. In a parts database used with the parameters, a special knowledge is necessary to handle the parts database because data format of those parameters is in a special format. And it is necessary to use a special apparatus or software to process the data stored in the parts database.

In addition, the conventional three dimensional CAD system only handles the arrangement information of the parts, and the parts database only handles information to build the parts. Thus, it is difficult for user to check both information at the same time in their designing process with the conventional three dimensional CAD system. In other words, a user configures parts by first using the parts database, and second, they adjust the arrangement of those built parts as a blocked component by using a three dimensional CAD system. Since these two steps are necessary to adjust an arrangement of the parts in the three dimensional virtual space in the conventional three dimensional CAD system, it is difficult to design by flexibly adjusting the arrangement in the three dimensional virtual space and changing the configuration of the parts data.

SUMMARY OF THE INVENTION

Accordingly, an advantage of an aspect of the present invention is to provide an apparatus and a method for processing parts information in a three dimensional CAD system, which can easily handle the data for the parts or the arrangement of the parts.

To achieve the above and other advantages, one aspect of the present invention provides an apparatus for processing parts information in a three dimensional CAD system that includes a parts table having data of one or more parts in a spreadsheet format, wherein the data includes arrangement data and element data for the parts; an arrangement adjusting unit, which refers to the arrangement data of the parts and adjusts a position of at least one of the parts; and, an element data editor, which refers to at least one of the element data for at least one of the parts and changes detailed configuration of the parts.

Another aspect of the present invention provides a method of processing parts information in a three dimensional CAD system that includes storing data for each of parts in a parts data block in a parts table, which has spreadsheet format, wherein the data is separately stored as arrangement data and element data; retrieving the arrangement data to locate the parts in a project area in the three dimensional CAD system; and retrieving the element data to create a detailed configuration of each of the parts in the three dimensional CAD system.

Another aspect of the present invention is to provide a computer program for processing parts information in a three dimensional CAD system that includes code for storing data for each of parts in a parts data block in a parts table, which has spreadsheet format, wherein the data is separately stored as arrangement data and element data; code for retrieving the arrangement data to locate the parts in a project area in the three dimensional CAD system; and code for retrieving the element data to create a detailed configuration of each of the parts in the three dimensional CAD system.

Further features, aspects and advantages of the present invention will become apparent from the detailed description of preferred embodiments that follows, when considered together with the accompanying figures.

DETAILED DESCRIPTION OF THE PREFERRED EMBODIMENTS

One embodiment in accordance with the present invention will be explained with reference to FIGS. 1 to 12.

Figure 1:
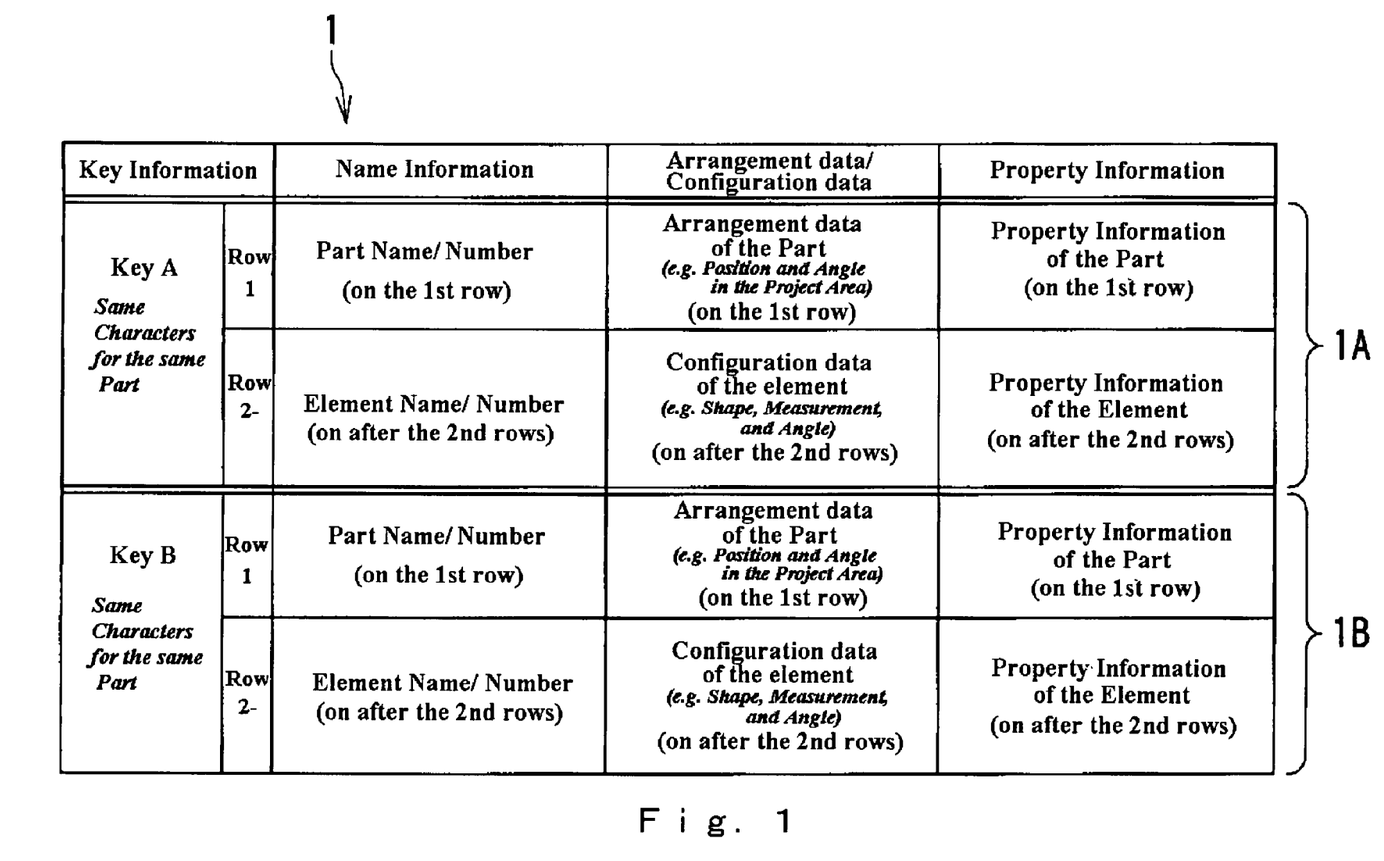
FIG. 1 is a parts table used in a three dimensional CAD system in accordance with one embodiment.

FIG. 1 shows a parts table used in a three dimensional CAD system in accordance with the embodiment. A parts table 1 has a spreadsheet format, and it can be edited by a general spreadsheet editor. It should be recognized that FIG. 1 is exemplary. One skilled in the art would recognize various modifications and alternatives, all of which are considered part of the present invention.

Parts table 1 includes data fields for a key information, name information, arrangement data, element data, and a property information of each part stored in the parts table 1.

Unique characters (or numbers) is allocated for each of the parts as the key information. In other words, the key information is identical characters (or number) commonly used for elements that configure the parts. The characters for the key information may be decided so that user can easily recognize the part.

The name information includes information about parts name or parts number. The arrangement data is information that is necessary to arrange the parts in the three dimensional virtual space, which is referred to as a "project area". The element data includes information relating to elements of the parts such as position of the element from the origin of the part, shapes, measurements, or angles.

The shapes of the elements may include basic shapes such as a rectangular parallelepiped, a cylinder, and a hemisphere. A complicated shape such as a Bezier curve may be avoided for simplicity because most of the configuration of the parts are obtained by combinations of the basic shapes.

Parts table 1 has data for a plurality of parts. Each set of data for one of the parts are registered as a parts data block 1A, 1B, etc. In other words, all the data in the parts data block 1A, 1B has the same key information. Each of the parts data block 1A, 1B, respectively in the parts table 1 includes arrangement data and element data for parts respectively each other.

In this embodiment, the arrangement data for the parts in the parts data block 1A, 1B is stored in the first row of each of the parts block 1A, 1B with a parts name information and a property information. The parts name information may be a name or a ID of the parts. The property information may include any information related to the parts. For example, the property information may be weight, discharge pressure, plant name, etc. when the part is, for example, a pump provided in the plant.

The arrangement data stored in the first row of the parts data block 1A, 1B is used for locating the parts in the project area. For example, in a plant designing process, the first row stores a position and an angle data of the parts with rectangular coordinate system or other convenient manner, such as a section that is divided by stays provided in the plant. The data stored in the first row in the parts data block 1A, 1B has a function of a database field since the name information and the property information are stored with the arrangement data.

Other rows in each of the parts data block 1A, 1B store data of the elements, respectively, which configure the parts related to the parts data block 1A, 1B, as element data. In FIG. 1 only one row of the element data is shown for ease of explanation, however there may be a plurality of rows which stores element data for a plurality of element, respectively. The element data are stored in a row in the parts data block 1A, 1B for each element, which is the basic shape or combination of basic shapes. The element data includes, for example, a name information, configuration data, and property data.

The name information includes information about element name, or element number. The name information may include type or shape of the element. The configuration data includes the shape of the element, measurements or angle in the relative coordinate whose origin is the position determined by the arrangement data. At least some of the configuration data may be stored in the same line with the arrangement data of the first row in the spreadsheet. The property information for the element data may include any information related especially to the element, not the parts. An example of the property information for the element data are such as a color of the element or combined data of the basic shape when the element is a combination of a plurality of the basic shape.

In this embodiment, as mentioned above, the parts data are stored in the parts table that has a spreadsheet format. Information of each of the parts, which are distinguished as the arrangement data and the element data, are stored in the same parts data block in the parts table. In each part data block, the arrangement data and the element data are separately stored (such as in the first row and the other rows). Thus, the parts data are stored in the parts table with a hierarchy structure. The data of the elements constitute the parts as the parts data block. Data of all of the parts, which are the parts data block, constitute the whole objects in the project area. Hereinafter, the whole data for the objects in the project area is referred as "project data".

As mentioned, the parts data for all of the parts in the project data are stored and managed in those hierarchical structures of the part table. The key information are allocated for each part data block so that each of the parts are able to be uniquely classified.

The arrangement data, stored in the first row of the parts data block, indicates the position and the angle of the parts in the project area. The position of the parts may be the position from the origin of the project area. The angle of the parts may be an angle of a reference line, which can be preferably determined for each of the parts, in the project area.

The parts itself are generally formed by a combination of the elements that have basic shapes such as a rectangular parallelepiped, a cylinder, or a hemisphere. Thus, rows other than the first row in the parts data block store the element data. The element data indicate the type of the basic element and the measurement of the basic element. In other words, the element data stores data of the position of the element in the relative coordinate, such as a rectangular coordinate system using X, Y, and Z, from the origin of the part and measurements necessary to configure the element in the configuration data. Hereinafter, the origin of a part, which is determined by arrangement data, is referred to as a "reference point". The measurements of the element necessary to be stored are determined by which type of the basic shape is adopted for the element. For example, when the basic shape for the element is a rectangular parallelepiped, measurements necessary to configure the element, which are to be stored in the configuration data, are a length, a width, and a height. When the basic shape for the element is a cylinder, measurements are a diameter and a length.

The basic shape, for example, a rectangular parallelepiped, a cylinder, or a hemisphere, has its own datum line, like the center line of the cylinder or one of a side of a rectangular parallelepiped. Therefore the angle information of the element is also stored in the configuration data because it is necessary to define an angle of the elements to configure the element. When applying the rectangular coordinate system using X, Y, and Z axis, the angle information may be stored as an angle of the datum line around Z-axis, an angle of the datum line with X-Y plane, and an angle of the element around the datum line. The angle of the datum line around Z-axis is referred to as a yawing angle. The angle of the datum line with X-Y plane is referred to as a pitching angle. The angle of the element around the datum line is referred to as a rolling angle.

Figure 2:
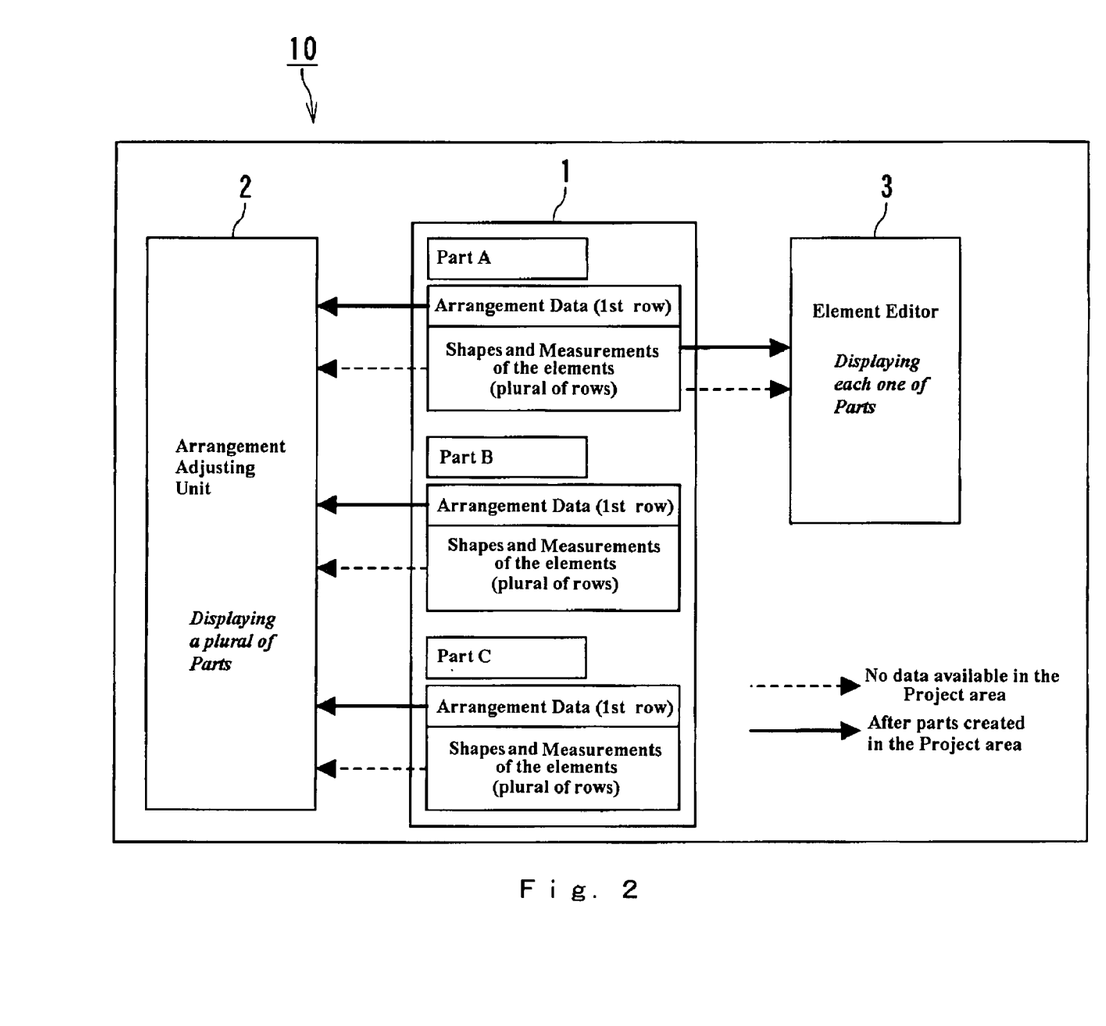
FIG. 2 is a schematic diagram of a system for processing parts information in a three dimensional CAD system in accordance with one embodiment.

FIG. 2 is a schematic diagram of an exemplary system for processing parts information in a three dimensional CAD system in accordance with the embodiment.

A data processing system 10 includes the parts table 1, which is mentioned above, an arrangement adjusting unit 2, and an element editor 3. The data processing system 10 include a computer program for processing parts information in the three dimensional CAD software. In that case, the arrangement adjusting unit 2 includes an arrangement adjusting program and the element editor 3 includes an element editing program or its elements.

The arrangement adjusting unit 2 is used to arrange the parts in the project area. The element editor 3 is used to change the configuration of each of the parts.

It is necessary to read all the information of the parts from the parts table 1 in order to adjust the arrangement of the parts in the project area when there is no parts in the project area. In other words, the arrangement adjusting unit 2 refers both to the element data and the arrangement data when there is no data for the parts available in the project area. This situation may occur when the three dimensional CAD system is rebooted, or when creating the new project data. The position and the angle of each of the element, which constitutes each of the parts, in the project area may be obtained by adding the arrangement data with the configuration data stored in the element data, which is the relative position and angle from the reference point of the respective parts. In other words, arrangement adjusting unit 2 arranges each of the parts after configuring each of the parts by referring to the element data. Otherwise, the arrangement adjustment unit 2 may use (call) the element data editor 3 in order to configure each of the parts.

Once the parts are created in the project area, it is unnecessary to refer detailed information of the parts, which are the element data that configure the parts, to adjust the arrangement of the parts if there is no additional or revised data in the element data. In such a case, the arrangement adjustment unit 2 only refers the arrangement data, which is stored in the first row of the each of the parts data block, to change the position of the parts or to turn the parts in the project area. In the other words, the position and the angle of each of the parts in the project area can be easily changed by simply revising the arrangement data of the parts in the parts table 1.

On the other hand, detailed configuration of the parts like measurements can be changed by revising the element data in the parts data block of the parts table 1 using the element editor 3. It is not necessary for user to look at all of the project area when changing detailed configuration of the parts. Therefore, Element editor 3 only refers the element data, which are stored in the second or later rows of the parts data block, to configure the parts. In other words, detailed configuration of the parts can be changed by editing the element data stored in each of the parts data block by using the element editor 3. The element editor 3 may have GUI to improve the efficiency of editing the element data. When detailed configuration of the parts has changed by the element editor 3, the arrangement adjusting unit 2 may refer to revised element data to update and configure the parts in the project area.

Arrangement adjusting unit 2 and element editor 3 are provided operatively simultaneously usable in the three dimensional CAD system. With this configuration, change of the detailed configuration of the parts by using the element editor 3 may be processed during a arrangement adjusting process of the parts in the project area using the arrangement adjusting unit 2.

With this embodiment, the data processing system handles the arrangement data, which is the first row of each of the parts data block, during the arrangement adjusting process of the parts in the project area. The amount of the data handled by the data processing system is only a part of the data stored in parts table during this process. Further, the data processing system handles the element data of the parts when a user wants to change its configuration during the change of the detailed configuration of the parts. The element data of the parts are stored in rows other than the first row of the parts data block for the parts. Again, the data processing system handles only a part of the data during this process. Therefore, the three dimensional CAD system uses smaller memory during the most of its operation compared to a conventional CAD system, because the data processing system basically handles only a part of the data during the most of its operation.

Figure 3A:
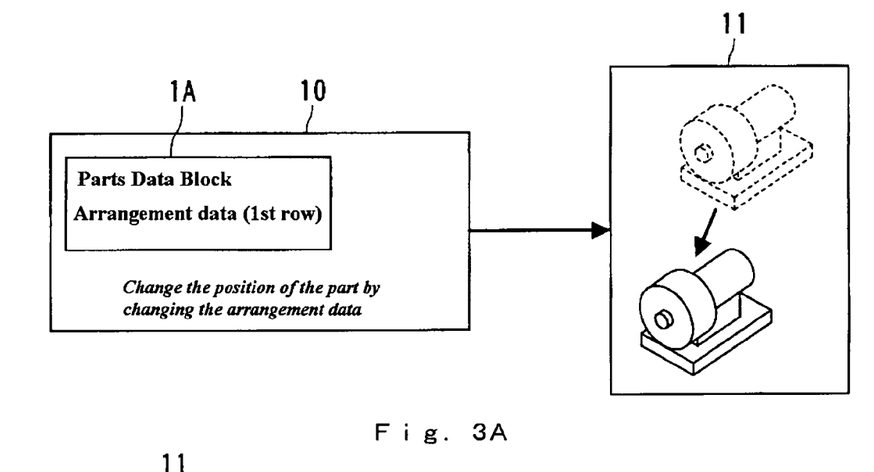
FIGS. 3A and 3B are schematic diagrams of an example of data transaction between the three dimensional CAD system and the data processing system in accordance with one embodiment.
Figure 3B:
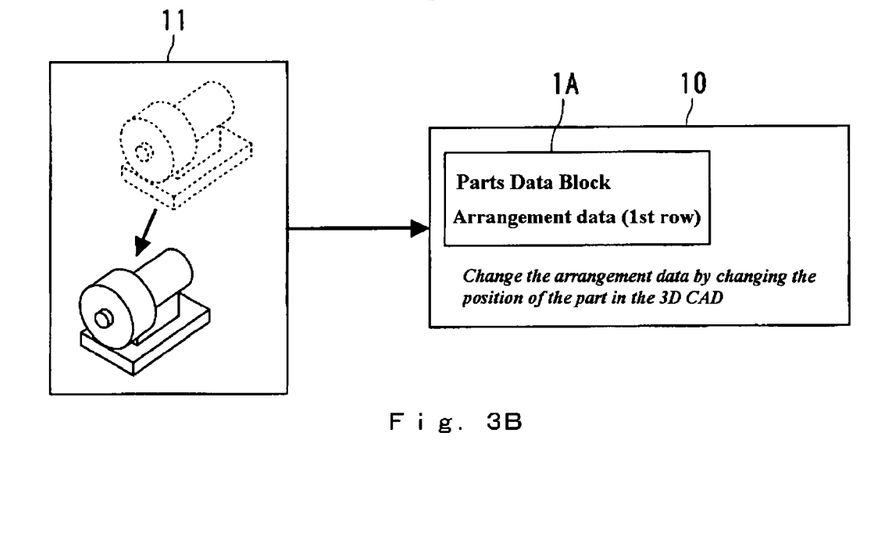

The data stored in the parts table 1 is transferred and connected to the three dimensional CAD system. FIGS. 3A and 3B shows a schematic diagram of an example of data transaction between the three dimensional CAD system and the data processing system in accordance with the embodiment.

As shown in FIG. 3A, when user changes the arrangement data which are stored in the first row in a parts data block 1A, the arrangement data is transferred to a three dimensional CAD system 11 from the data processing system 10. The three dimensional CAD system 11 recalculates the position of the parts in the project area. On the contrary, when user changes the position of one of the parts using the three dimensional CAD system 11 in a conventional manner, the position after the change is transferred to the data processing system 10. The data processing system 10 receives the position after the change as the arrangement data which is then stored in the first row of the parts data block 1A of the parts as shown in FIG. 3B. When a user changes the element data in the parts data block 1A in the data processing system 10, or changes the detailed configuration of the parts using the three dimensional CAD system, the same procedure can be followed. A data transferring and a data receiving unit (not shown) may be further accommodated in the data processing system 10. Otherwise, arrangement adjusting unit 2 or element data editor 3 may include the function to transfer the data between the data processing system 10 and the three dimensional CAD system 11.

The data processing system may further comprises a parts data block library.

The conventional CAD system has a library, which stores shapes and other data of the elements. The elements are configured by setting parameters in a function stored in the library. This may be helpful to configure the element when the element is a simple shape such as a cylinder because the number of the parameters set in the function is limited. However, complicated shape of the parts, which are generally a combination of a simple-shaped elements, are hard to configure because many parameters are necessary for the configuration of parts.

In this embodiment, the parts data block library stores each of the parts data block shown in FIG. 1 as existing parts. The parts data block library has the same format in the spreadsheet as the parts table 1 shown in FIG. 1. The arrangement data stored in the first row of the parts data block of the parts table are not necessary for the parts data block library, however columns for the arrangement data may be included for the parts data block library. It makes it easy for user to transfer (for example, be copy and paste) the parts block data stored in the parts data block library to the parts table when using a general spreadsheet editor. Key information for each of the parts data block stored in the parts data block library may be changed as a unique character, such as a serial number, to all of the data regardless the project. This makes it easier to transfer the data in the parts data block of one project to another project.

The parts data block library is a parts database that stores detailed parts data in each of the parts data block as the existing parts data. Detailed parts data, which are the element data stored in after the second row in the parts data block, can be easily obtained from the parts data block library as the existing parts data.

The name and property information for the parts, which is stored in the first row of the parts data block may be used as a keyword to searching the parts data stored in the parts data block library. In other words, user can search the name or property information in the parts data block library with any keywords. As mentioned, a library used in a conventional three dimensional CAD system stores only simple shapes of the element. Property information for the elements stored in the library are only general information. On the other hand, the parts data block library can store detailed configuration of the parts with detailed property information as the existing parts data.

Figure 4:
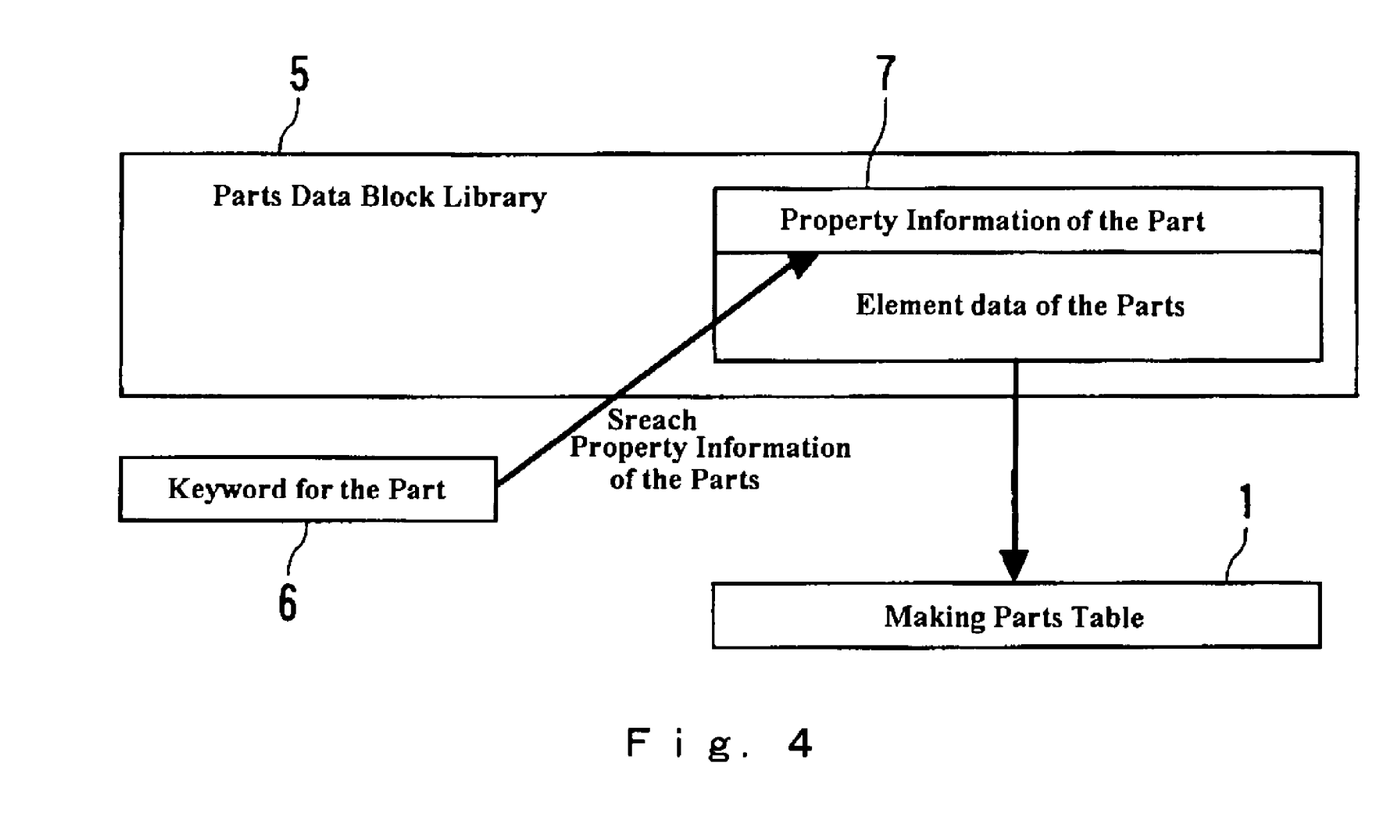
FIG. 4 is a schematic diagram which shows the process of using the parts data block library.

FIG. 4 is a schematic diagram which shows the process using the parts data block library. Reference numeral 1 denotes the parts table, 5 denotes the parts data block library, 6 denotes the keywords that user applies, and 7 denotes the parts data block.

A user can easily find the detailed parts in the parts data block library 5 by using keywords 6. The parts data block 7 having the keyword 6 in the name or property information of the part is searched. If the keyword 6 is found in the parts data block 7, the detailed parts data are easily retrieved in the parts table 1 because a format of the parts data block 7 of the parts data block library 5 is the same as the parts data block of the parts table 1. When adding the parts found in the parts data block library 5 to the project area, the data of the parts data block 7 are just added to the parts table 1 with the arrangement data, which are the position and the angle in the project area to be stored in the first row of the parts data block. The element data of the parts may be revised to change the detailed configuration of the part. Also the name and the property information for the part may be changed. Then, the part is configured and arranged in the project area.

As mentioned above, data related to a movement or a rotation of the parts in the project area is stored in a row of the arrangement data of each of the parts data block. The position and the angle in the project area can be changed by changing the arrangement data of the parts. On the contrary, the arrangement data may preferably be revised when user changes the position or the angle by using the three dimensional CAD system.

The parts table stores arrangement data and the element data for each of the parts in a spreadsheet format. Thus, user may change the arrangement or the detailed data of the parts without using the three dimensional CAD system.

For example, to arrange a plurality of parts along the base line, it is enough to change the position data in the arrangement data for those parts so that the position data align with the base line. If the base line is an axis of the project area, it can be accomplished by changing the position data except the axis corresponds to the base line.

Figure 5:
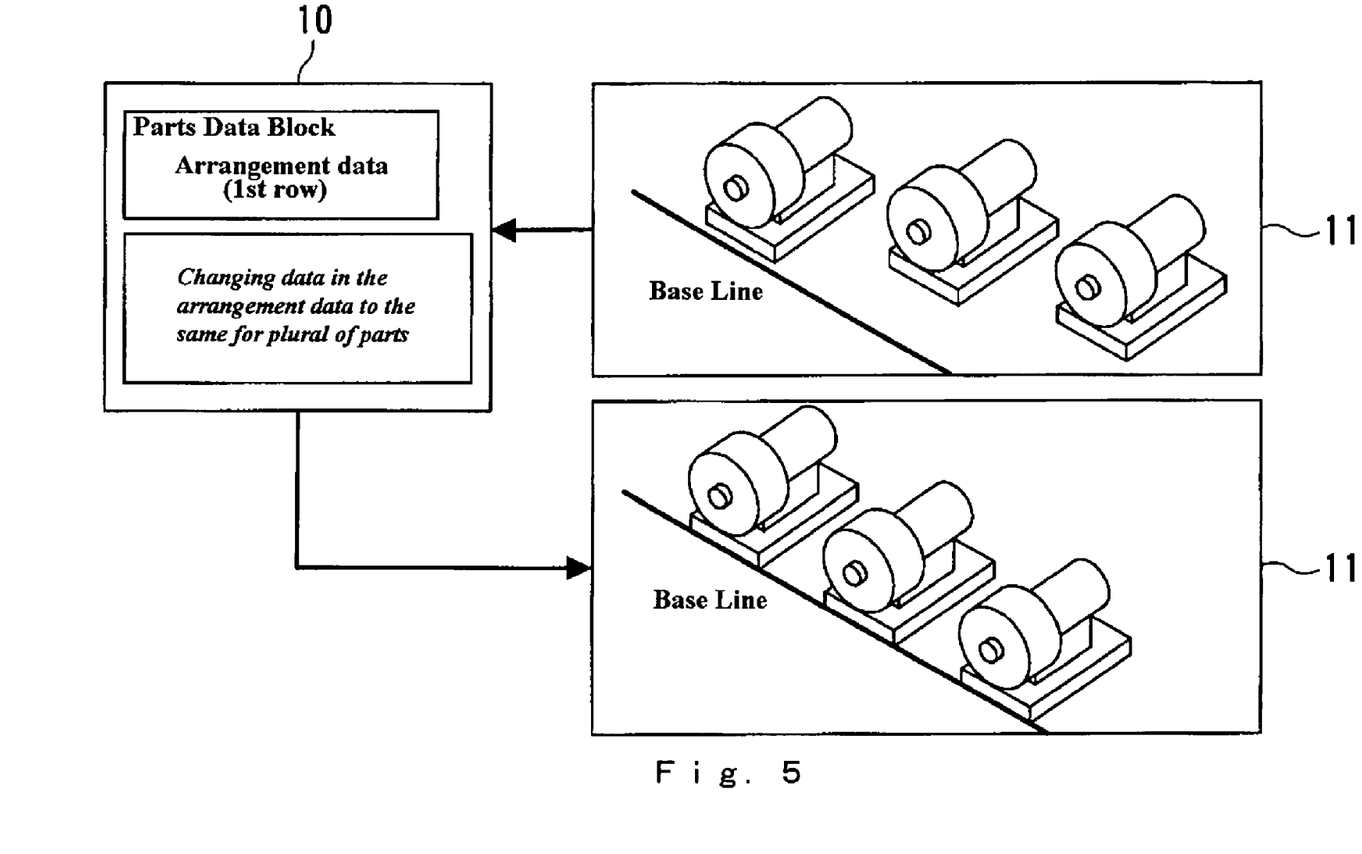
FIGS. 5 to 7, 9, 11, 12 are schematic diagrams showing the data processing in the data processing system in accordance with one embodiment.

FIG. 5 is a schematic diagram showing this process. The arrangement data for a plurality of parts are changed by data processing system 10 to align the parts along the base line in the project area. This may improve the efficiency of the designing because aligning a plurality of the parts along the base line is necessary during the designing process.

Figure 6:
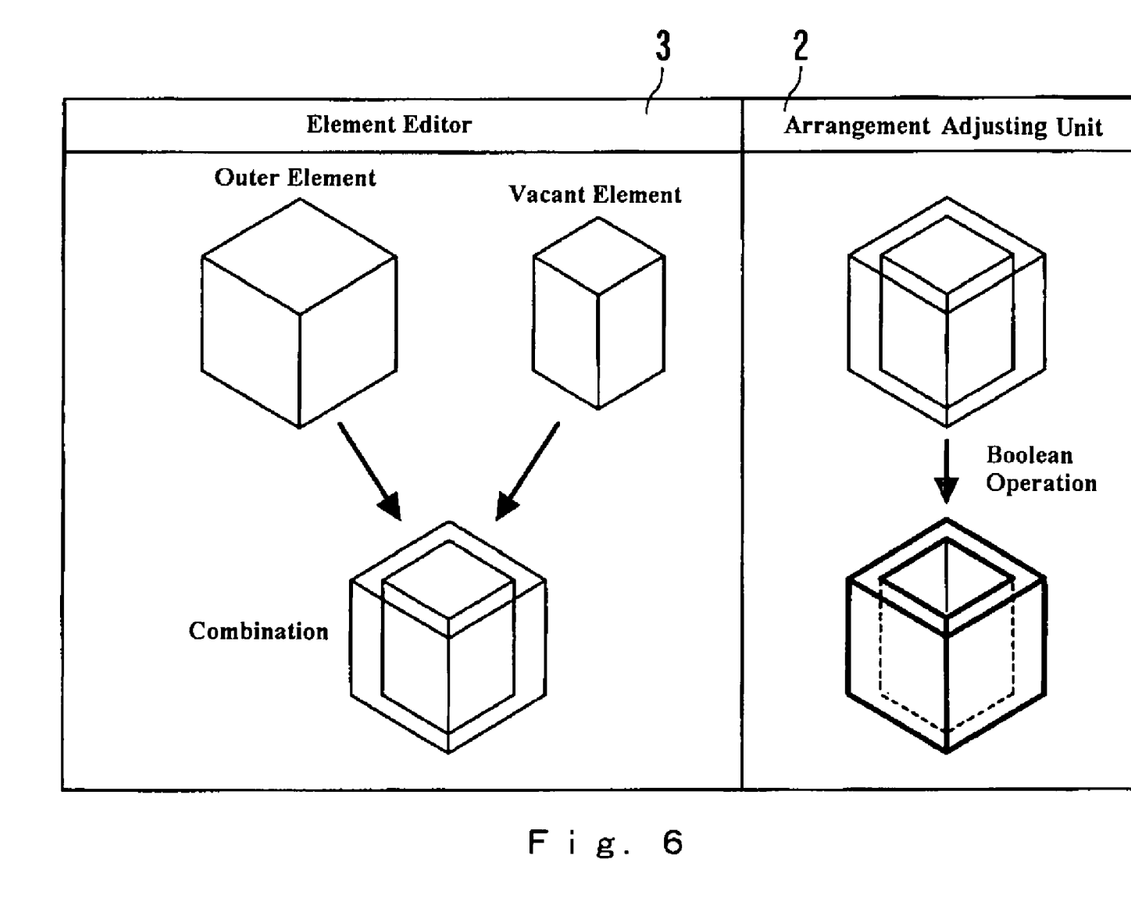

The data processing system in accordance with the embodiment can handle the parts which have a hollowed out portion as shown in FIG. 6. FIG. 6 is a schematic diagram for processing parts having a hollowed out portion according to the embodiment.

Data for an outer element, which is the parts before hollowed, and data for a vacant element, which is an element to be hollowed, are stored as elements stored in the element data of the data table. In other words, data of the parts which are defined as a hollowed out portion are defined as a combination of the outer element and the vacant element. Data for a vacant element are preferably marked in the element data so that it can be hollowed out from the outer element. The mark may be stored in the property information or the configuration data for the element. The vacant element is hollowed out from the outer element by using a Boolean operation. Especially when arranging the parts in the project area, the parts are arranged with its vacant element hollowed out by the process of the Boolean operation because it is important to check spatial conflicts of each of the parts with others. Thus, the arrangement adjusting unit 2 has the function of performing the Boolean operation. However, when configuring the detail of each of the parts, it is not that important for the vacant element to be hollowed out from the outer element. Therefore, the element data editor 3 may be configured not to process the Boolean operation. In such a case, it may be helpful for the user to highlight or change a color of the vacant element. This can be easily accomplished by referring to the mark stored in the data of the vacant element.

With the data processing system in accordance with the embodiment, the property information or other information may be easily labeled to the parts or displayed on the plane near the parts in the project area as a reference.

Figure 7:
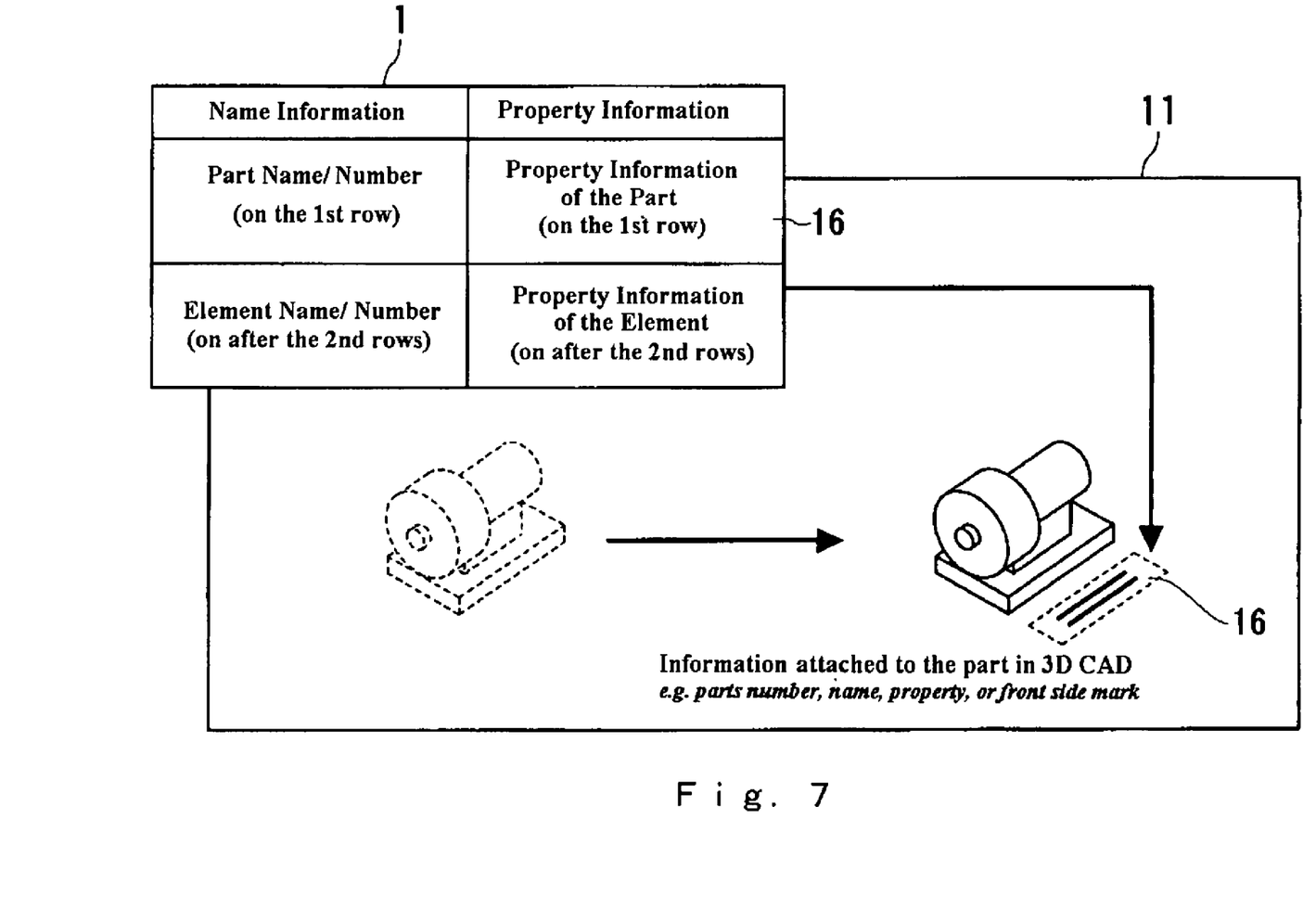

FIG. 7 is schematic diagram showing this process. The reference information 16 which user wants to display is stored in the property information of the parts table 1. The elements editor and the arrangement adjusting unit refers to the reference information 16, and the reference information 16 stored is arranged in the project area near the image of the parts in the three dimensional CAD system 11. Not only the reference information 16 of the parts, the reference information 16 may be stored in the property information of any of the individual element data making up a part. A direction of the parts can be attached with the image of the parts in the three dimensional CAD system 11. For example, the shape of a switching box arranged in the plant is just a box. However, the information that shows a side of the door is important when arranging the switching box in the plant. In such a case, a mark, such as a red colored triangular pyramid, may be put in front of the door of the switch box as it indicates the front side of the switch box. Such a mark may be stored as one of the elements in the parts data block in the parts table 1.

The element editor of the data processing system of the embodiment may display any of the parts in three dimensional space as a perspective view drawing. User can edit the element data of the parts table by using the GUI.

Figure 8:
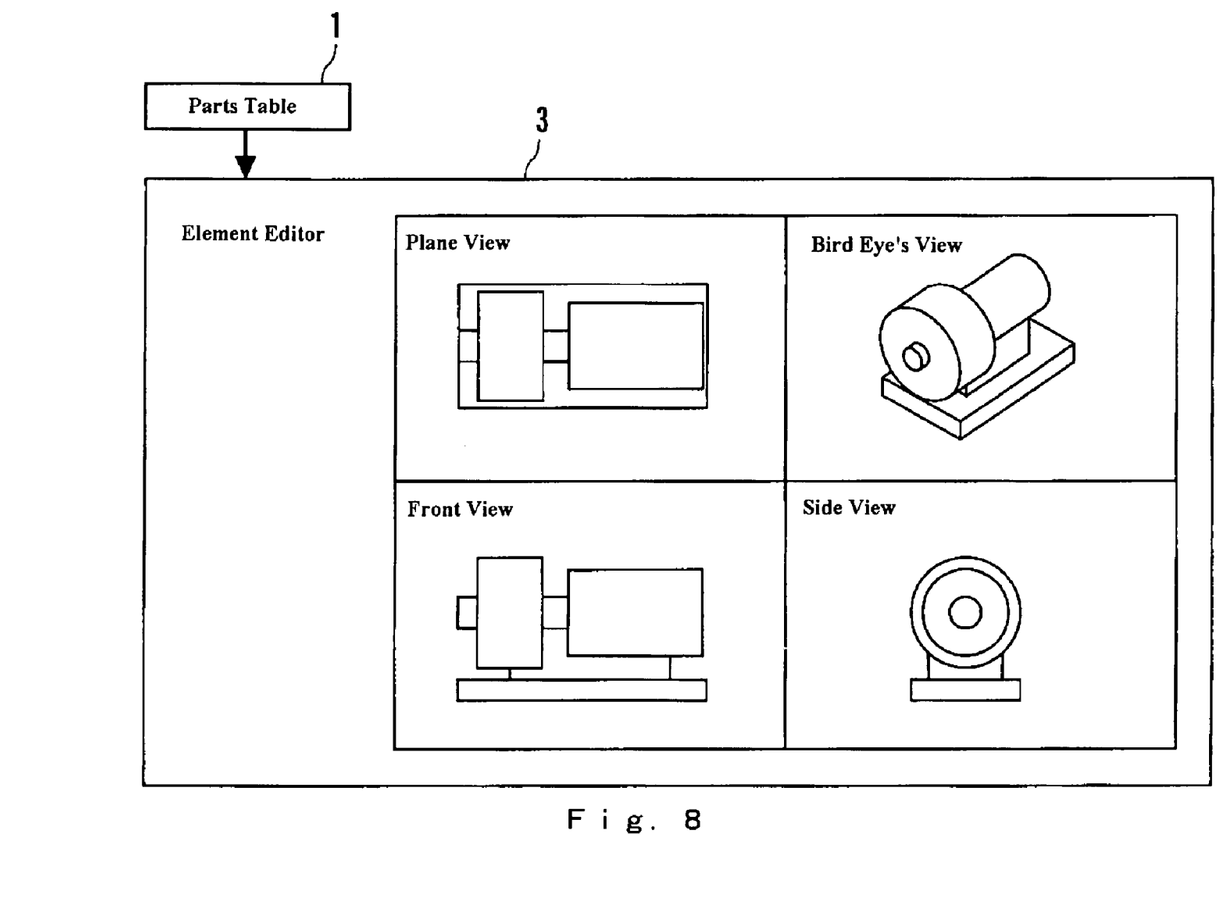
FIG. 8 is a sample image of the parts in two and three dimensional views.

When editing the element data with the GUI, the element editor may display two dimensional drawings, such as a plan view, a front view, and a side view, together with the perspective view (or bird eye's view) of the parts. FIG. 8 is a sample image showing the parts with two and three dimensional views. Element editor 3 gets the element data of one of the parts from the parts table and displays it in four drawings, such as a plan view, a front view, and a side view, and a bird eye's view. The center lines of the two dimensional view are aligned, and the scale of the drawings may be made uniform. The scale is calculated so that four of the drawings of the parts can be fully drawn in a screen.

The element editor may capture two dimensional image of the parts in a two dimensional CAD system or a drawing to display the two dimensional data in the project area as a background drawing. This helps the user to make the three dimensional data from existing two dimensional image. The two dimensional image captured may be electronic data, or a drawing image itself. Image of the drawing itself can be captured by using a scanner.

Figure 9:
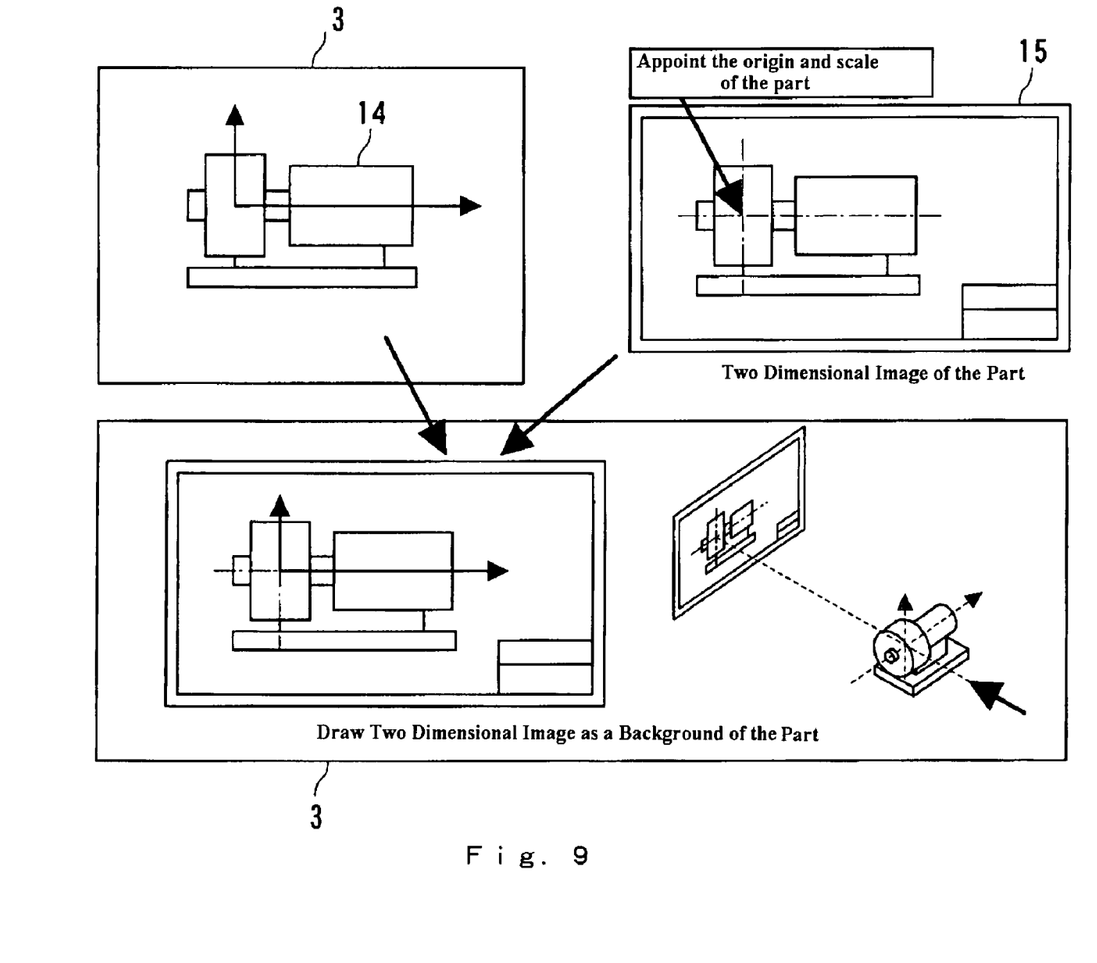

FIG. 9 is schematic diagram showing this process. Element data for Part 14 are stored in the part table. The element editor 3 can draw the front view of the part 14. Element editor 3 captures the two dimensional image of the part 14, and user selects the origin and the scale of the part 14 in the captured image. Once the origin and the scale of the parts 14 in the captured image is appointed, the element editor arranges the image on the background of the part 14 in a front view or a bird eye's view. The captured image may be stored as one of the element of the part 14 for the reference of the original two dimensional drawing when the three dimensional data is created based upon the two dimensional data.

Figure 10:
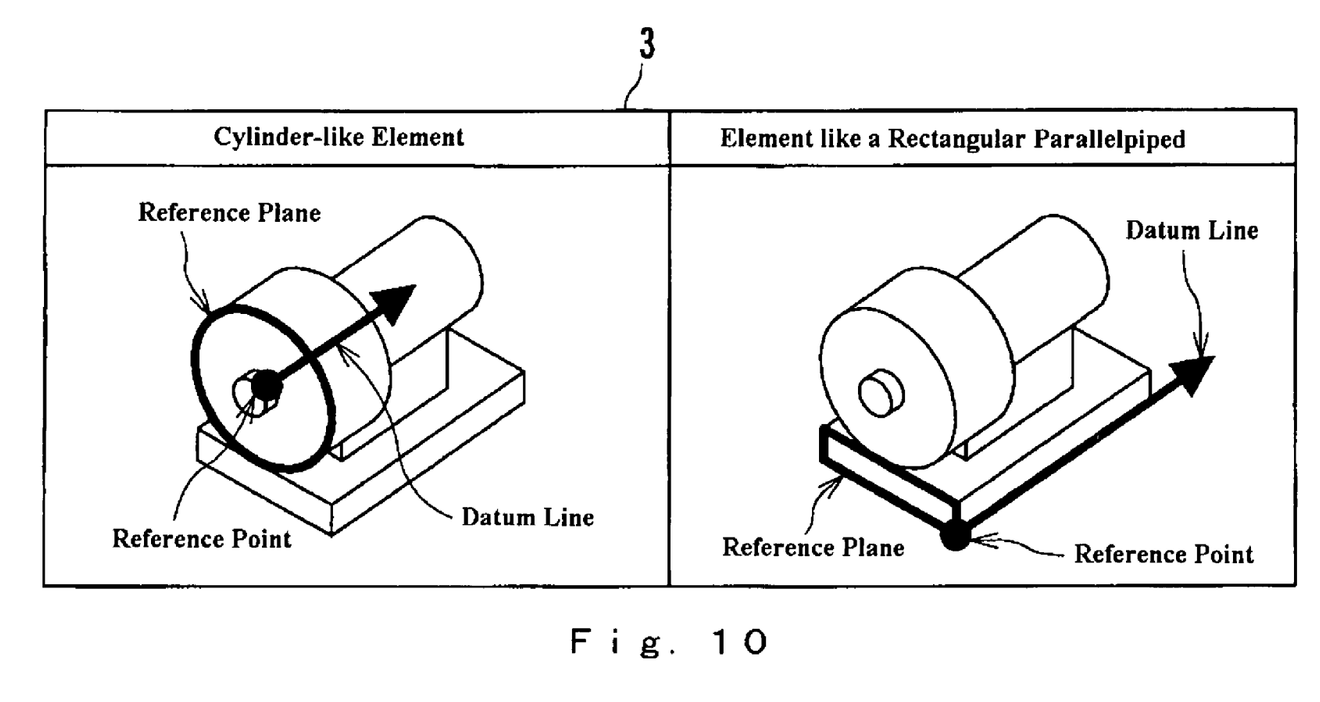
FIG. 10 shows a sample image of the reference point, the datum line and the reference plane shown with the image of the parts in FIG. 8.

The element editor 3 may highlight one of the element or show other information to improve the efficiency of editing process of the element data. As mentioned, each of the parts has a reference point, a datum line, and a reference plane. Showing the reference point, the datum line or the reference plane is helpful for user to configure the parts by the element editor because the parts are arranged in the project area based upon the reference point, the datum line, and the reference plane. FIG. 10 shows a sample image with the reference point, the datum line and the reference plane shown with the image of the parts. Element editor 3 highlights the reference point and the reference plane, and show datum line as an arrow.

Figure 11:
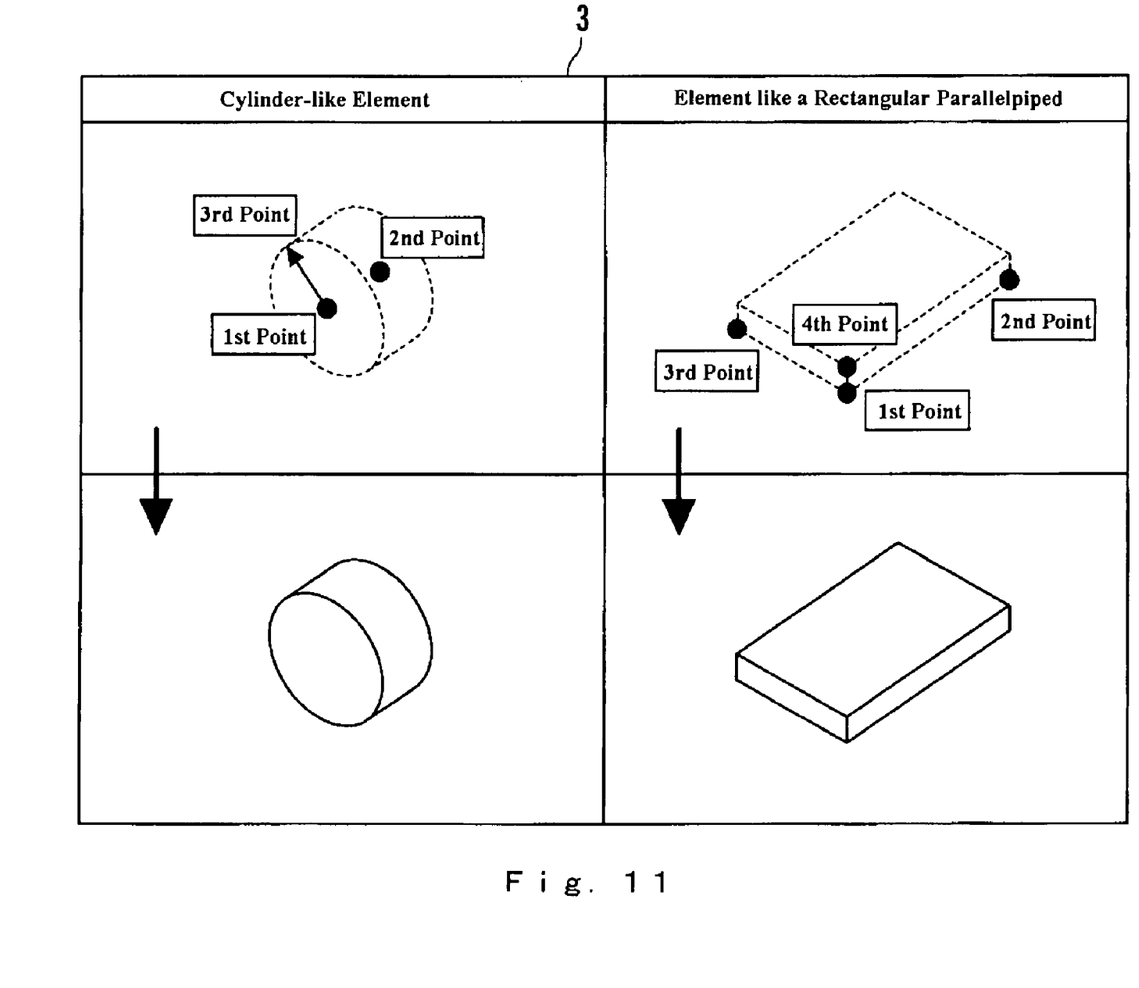

The element editor 3 may be configured to add the element to the parts by simply selecting the points of the element. FIG. 11 is a schematic diagram which shows this process. As shown in FIG. 11, element like a cylinder can be created by selecting three points. In this case, the first point defines the center of a end circle, the second point defines another end circle, the third (last) point defines radius. Element like a rectangular parallelepiped can be created by selecting four points. In this case, the first three point defines length and width of the rectangular parallelepiped, and the forth (last) point defines the height. Thus, the user needs to select those points, for example, by using such a pointing device to add or make the element. The order of pointing may be preferably changed. Other basic element can be created in the same manner.

Figure 12:
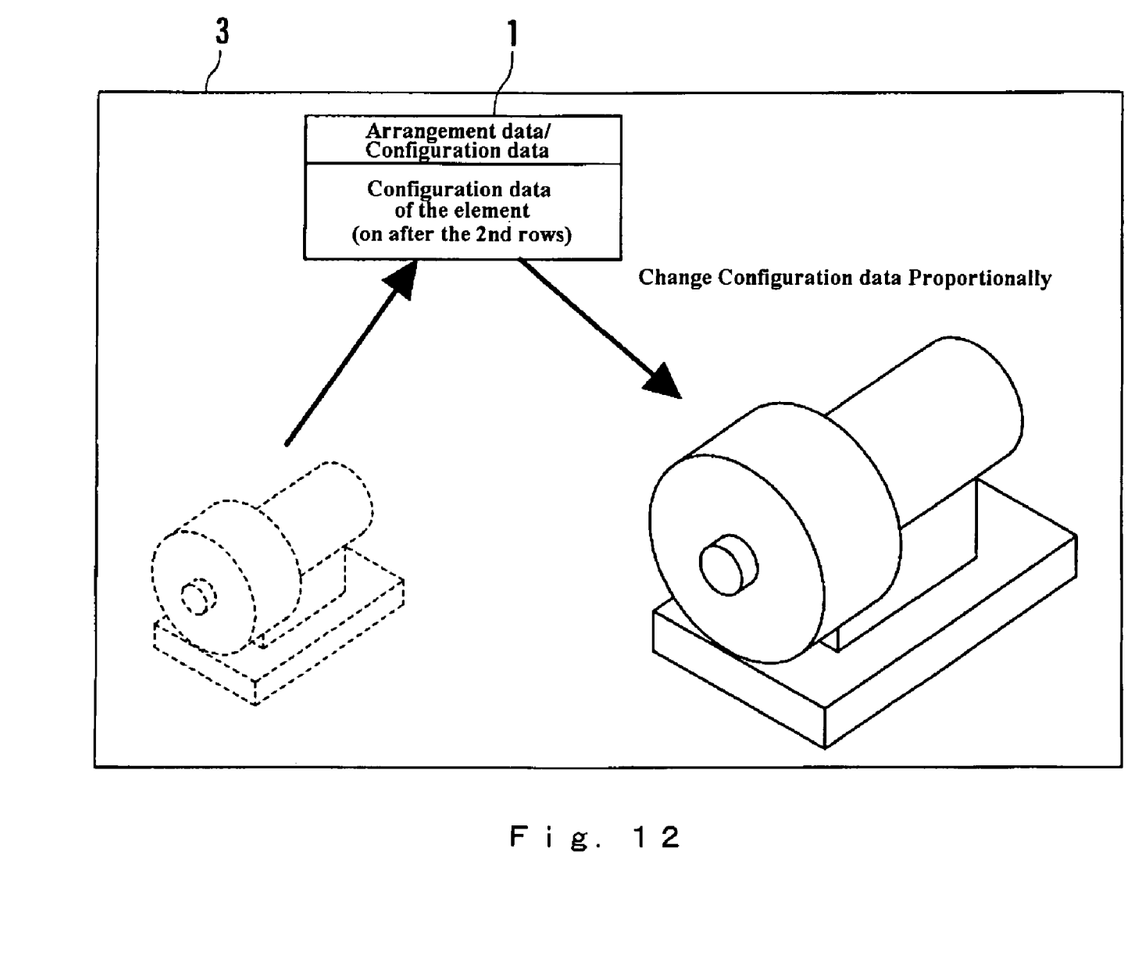

The element editor 3 may easily expand or reduce the size of the parts. FIG. 12 is a schematic diagram of this process. As mentioned, the parts table 1 has a spreadsheet format, the measurement of the parts can be changed proportionally by the element editor 3. The parts can be expanded or reduced only the particular direction by calculating particular line of the element data.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. An apparatus for processing parts information in a three dimensional CAD system, comprising:
  a data processing system comprising:
    a parts table, having data of one or more parts in parts data blocks in a spreadsheet format, wherein the data includes arrangement data and a plurality of element data for the one or more parts;
    an element data editor, which refers to at least one of the plurality of element data for at least one of the one or more parts in parts data blocks and changes detailed configuration of the one or more parts; and
    a spreadsheet editor that generates and changes arrangement data stored in the parts data blocks of the parts table; and
  a three dimensional CAD system comprising:
    a project area;
    an arrangement adjusting unit, which refers to the arrangement data of the one or more parts in the parts data blocks and adjusts a position and/or orientation of at least one of the one or more parts in the project area;
    wherein changing the arrangement data stored in the parts data blocks of the parts table causes simultaneous changes to arrangement of the one or more parts in the project area in the three dimensional CAD system; and
    changing the position and/or orientation of at least one of the one or more parts in the project area in the three dimensional CAD system causes simultaneous changes to the arrangement data stored in the parts data blocks of the parts table.

2. The apparatus for processing parts information in a three dimensional CAD system according to claim 1,
wherein the parts table includes sets of parts data blocks, each parts data block being a set of data for a part;
wherein the parts data block includes common data for the part as the arrangement data, and parts element data, which is data of sub-parts for the part, as the element data.

3. The apparatus for processing parts information in a three dimensional CAD system according to claim 2, wherein the arrangement data of each of the one or more parts is stored in one row in the parts data blocks of corresponding parts, respectively, wherein each of the parts data blocks is stored with a name and property information provided on a first row of the respective parts data blocks, and wherein the name and the property information is used as keywords for searching the parts data blocks stored in the parts table.

4. The apparatus for processing parts information in a three dimensional CAD system according to claim 1,
wherein the arrangement adjusting unit and the element data editor are operatively usable simultaneously.

5. The apparatus for processing parts information in a three dimensional CAD system according to claim 1,
wherein data in the parts table is edited by the spreadsheet editor.

6. The apparatus for processing parts information in a three dimensional CAD system according to claim 1, further comprising:
a parts data block library that stores the arrangement data and the element data.

7. The apparatus for processing parts information in a three dimensional CAD system according to claim 1, wherein
changing the element data stored in the parts data blocks of the parts table causes simultaneous changes to detailed configuration of the parts in the project area in the three dimensional CAD system.

8. The apparatus for processing parts information in a three dimensional CAD system according to claim 1, wherein:
changing detailed configuration of the parts in the project area in the three dimensional CAD system causes simultaneous changes to the element data stored in the parts data blocks of the parts table.

9. A computer implemented method of processing parts information in a three dimensional CAD system, comprising:
storing in a memory of a data processing system, data for parts in parts data blocks in a parts table, which is in a spreadsheet format,
wherein the data is separately stored as arrangement data and element data;
retrieving the arrangement data stored in parts data blocks and locating the parts in a project area in the three dimensional CAD system;
retrieving the element data stored in parts data blocks and creating a detailed configuration of each of the parts in the project area in the three dimensional CAD system,
changing the arrangement data stored in the parts data blocks of the parts table causing simultaneous changes to arrangement of the parts in the project area in the three dimensional CAD system; and
changing the location and/or orientation of the parts in the project area in the three dimensional CAD system causing simultaneous changes to the arrangement data stored in the parts data block of the parts table.

10. The method of processing parts information in a three dimensional CAD system according to claim 9, further comprising:
changing the element data stored in the parts data blocks of the parts table causing simultaneous changes to the detailed configuration of the parts in the project area in the three dimensional CAD system.

11. The method of processing parts information in a three dimensional CAD system according to claim 9,
wherein the parts are aligned along a base line in the project area in the three dimensional CAD system.

12. The method of processing parts information in a three dimensional CAD system according to claim 9, further comprising:
changing the detailed configuration of the parts in the project area in the three dimensional CAD system causing simultaneous changes to the element data stored in the parts data blocks of the parts table.

13. The method for processing parts information in a three dimensional CAD system according to claim 9, wherein the element data of the parts which have a hollowed out portion are defined as a combination of an outer element and a vacant element, further comprising:
performing Boolean operation to hollow out the vacant element from the outer element when arranging the parts in the project area in the three dimensional CAD system.

14. The method of processing parts information in a three dimensional CAD system according to claim 9, further comprising:
storing a property information in the parts data block together with the arrangement data and the element data,
retrieving the property information from the parts data block to display the property information with the parts in the project area in the three dimensional CAD system.

15. The method of processing parts information in a three dimensional CAD system according to claim 9, further comprising:
displaying the element data in a plane view, a front view, a side view and a perspective view at the same time.

16. The method of processing parts information in a three dimensional CAD system according to claim 9, further comprising:
capturing a two dimensional image of the parts; and
displaying the two dimensional image of the parts as a background of the parts.

17. The method of processing parts information in a three dimensional CAD system according to claim 9, further comprising:
storing information of at least one of a reference point, a reference plane and a datum line of the parts in the parts data blocks; and,
highlighting in a display at least one of the reference point, the reference plane and the datum line.

18. The method of processing parts information in a three dimensional CAD system according to claim 9, wherein the arrangement data of each of the one or more parts is stored in one row in the parts data blocks of corresponding parts, respectively, wherein each of the parts data blocks is stored with a name and property information provided on a first row of the respective parts data blocks, and wherein the name and the property information is used as keywords for searching the parts data blocks stored in the parts table.

19. computer readable medium storing computer executable instructions, that when executed on a computer, processes parts information in a three dimensional CAD system, the computer medium comprising instructions for:
storing in a memory of a data processing system, data for parts in parts data blocks in a parts table, which is in a spreadsheet format, wherein the data is separately stored as arrangement data and element data;

retrieving the arrangement data stored in parts data blocks and locating the parts in a project area in the three dimensional CAD system;

retrieving the element data stored in parts data blocks and creating a detailed configuration of each of the parts in the project area in the three dimensional CAD system, changing the arrangement data stored in the parts data blocks of the parts table causing simultaneous changes to arrangement of the parts in the project area in the three dimensional CAD system; and changing the location and/or orientation of the parts in the project area in the three dimensional CAD system causing simultaneous changes to the arrangement data stored in the parts data block of the parts table.

20. The computer readable medium storing computer executable instructions according to claim 19, further comprising instructions for:

changing the element data stored in the parts data blocks of the parts table causing simultaneous changes to the detailed configuration of the parts in the project area in the three dimensional CAD system.

21. The computer readable medium storing computer executable instructions according to claim 19, further comprising instructions for:

changing the detailed configuration of the parts in the project area in the three dimensional CAD system causing simultaneous changes to the element data stored in the parts data blocks of the parts table.

22. The computer readable medium storing computer executable instructions according to claim 19, wherein the arrangement data of each of the one or more parts is stored in one row in the parts data blocks of corresponding parts, respectively, wherein each of the parts data blocks is stored with a name and property information provided on a first row of the respective parts data blocks, and wherein the name and the property information is used as keywords for searching the parts data blocks stored in the parts table.

* * * * *